United States Patent [19]

Fried et al.

[11] Patent Number: 4,862,412

[45] Date of Patent: Aug. 29, 1989

[54] CONTENT-ADDRESSABLE MEMORY HAVING CONTROL CIRCUITRY AND INDEPENDENT CONTROLS FOR MATCH AND WRITE CYCLES

[75] Inventors: Jeffrey A. Fried, Somerville; Christopher P. Rosebrugh, Beverly, both of Mass.

[73] Assignee: GTE Laboratories Incorporated, Waltham, Mass.

[21] Appl. No.: 185,624

[22] Filed: Apr. 25, 1988

[51] Int. Cl.⁴ ............................................. G11C 15/00
[52] U.S. Cl. ................................ 365/49; 365/189.07; 365/154; 365/189.08; 365/156
[58] Field of Search ................ 365/49, 189, 154, 156, 365/190, 189.07, 189.08

[56] References Cited

U.S. PATENT DOCUMENTS

| | | | |
|---|---|---|---|
| 3,575,617 | 4/1971 | Burns | 365/49 |
| 3,609,710 | 9/1971 | Browne | 365/49 |
| 3,633,182 | 1/1972 | Koo . | |
| 4,377,855 | 3/1983 | Lavi | 365/49 |
| 4,656,626 | 4/1987 | Yudichak et al. | 365/49 |
| 4,694,425 | 9/1987 | Imel | 365/49 |

OTHER PUBLICATIONS

Weste et al., "Principles of CMOS VLSI Design", Addison-Wesley Publishing Co., 1985, pp. 349-353.

Primary Examiner—Glenn A. Gossage
Attorney, Agent, or Firm—David M. Keay; James J. Cannon, Jr.

[57] ABSTRACT

A content-addressable memory (CAM) consisting of an array of memory cells arranged in a matrix by rows and columns is disclosed in which each memory cell includes a pair of cross-coupled CMOS inverters for storing a representation of a single bit. The bits in each row of memory cells constitute a keyword. Keywords are entered into the memory one row at a time. All of the stored keywords are compared to a single search word simultaneously during a match operation. The CAM is prepared for a match operation by placing a charge on a match line associated with each row. If all the bits of the search word match the bits of the stored keyword, the associated match line remains charged producing a match signal for the row of memory cells. If any bit of the search word does not match the corresponding bit of the stored keyword, the associated match line is discharged producing a no-match signal for the row of memory cells.

18 Claims, 3 Drawing Sheets

CONTENT-ADDRESSABLE MEMORY HAVING CONTROL CIRCUITRY AND INDEPENDENT CONTROLS FOR MATCH AND WRITE CYCLES

BACKGROUND OF THE INVENTION

This invention relates to content-addressable memories. More particularly, it is concerned with an array of memory cells and control circuitry for storing a set of keywords and for comparing the stored keywords to a search word of input data.

Content-addressable memories simultaneously compare a search word with a set of stored keywords. An indication of whether or not the search word matches the stored keywords is produced for each stored keyword. A distinguishing characteristic of a content-addressable memory (CAM) is that each stored keyword is uniquely identified on the basis of the content of the keyword itself, rather than by its address within the memory array as in conventional digital memories.

A content-addressable memory includes an array of memory cells arranged in a matrix of rows and columns. Each memory cell stores a single bit of digital information. The bits stored in a row of memory elements constitute a stored keyword. A search word of input data is simultaneously applied to all the rows during a match operation, and an indication is produced for each row as to whether or not the search word matches the keyword stored therein.

With conventional content-addressable memories charges present on the data input lines to the memory cells are used to compare each bit of the search word with the corresponding bit of the stored keyword. This approach depends on the ratio of the data input line capacitance to the cell storage node capacitance, and the ratio of the input driving current to the driving current within a memory cell. Thus, as the number of memory cells in the array are increased, comparison during a match operation becomes slower. A design based on these ratios also limits the operating speed even for small arrays, because the size of the drive transitors of a memory cell is limited by the need to overpower them during a write operation. In addition this approach also requires sensitive circuits on the data input lines in order to detect small voltage swings during the match operation.

SUMMARY OF THE INVENTION

A content-addressable memory in accordance with the present invention comprises an array of memory cells each of which is operable to store a bit of digital information. The memory cells are arranged in a matrix of J rows and K columns. The memory includes K first data lines and K second data lines. A first data line and a second data line are associated with each column of memory cells and are coupled to each memory cell of the associated column for applying a bit and its complement to the memory cells of the column. Row select means includes J row select lines. Each row select line is associated with a row of memory cells and is coupled to each memory cell of the row. Each memory cell is operable to store a representation of the bit present on the first data line coupled thereto and its complement present on the second data line coupled thereto during a ROW SELECT signal on the row select line coupled thereto. Match means includes J match lines. Each match line is associated with a row of memory cells and is coupled to each memory cell of the row. Each memory cell is operable to produce a NO-MATCH signal on the match line coupled thereto in response to a PRE-CHARGE signal on the match line when a bit is present on the first data line coupled thereto and its complement is present on the second data line coupled thereto which bit and its complement have a predetermined relationship to the representation of the bit stored in the memory cell.

For a better understanding of the present invention, together with other and further objects, advantages, and capabilities thereof, reference is made to the following disclosure and appended claims in connection with the above-described drawings.

DETAILED DESCRIPTION

Figure 1:
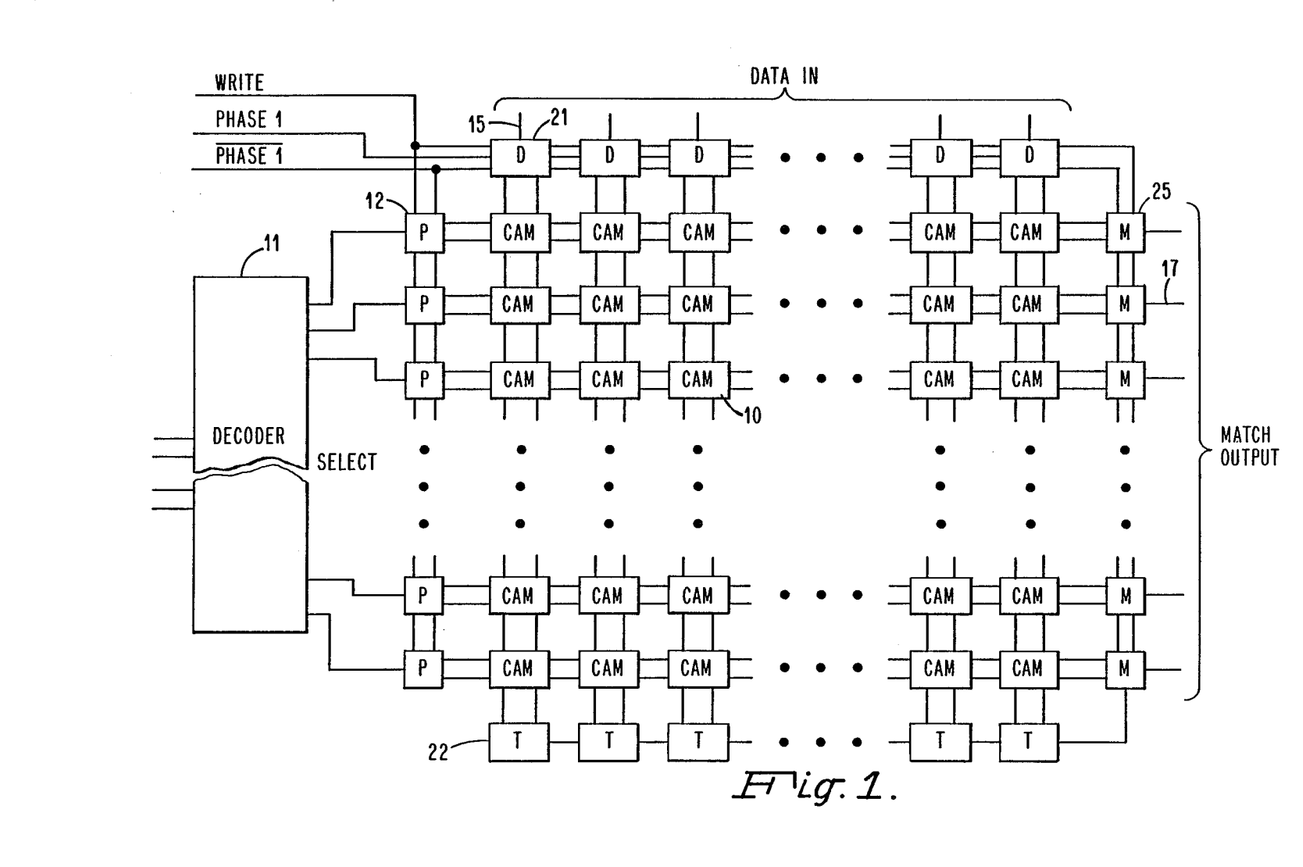
FIG. 1 is a block diagram of a content-addressable memory in accordance with the present invention.

A content-addressable memory in accordance with the present invention as illustrated in the block diagram of FIG. 1 includes an array of memory cells 10 together with control circuitry. The array of memory cells is arranged in a matrix of J rows by K columns (for example, 16 rows by 10 columns), thus providing the capability of stores J K-bit (sixteen 10-bit) keywords. Each memory cell stores a single bit of digital information. Each memory cell includes circuitry for storing the single data bit and for comparing the stored bit with a corresponding input bit of the search word during a match operation. The content-addressable memory stores individual keywords one keyword at a time in a row of memory cells, and compares a search word to all of the stored keywords simultaneously.

The apparatus as illustrated includes a decoder 11 for decoding log$_2$ J binary coded inputs to provide a SELECT signal on one of J select lines, one to each of the rows of memory cells. For each row of memory cells 10 there is a precharge circuit 12, labelled P. Each precharge circuit 12 causes the associated row of memory cells to write in bits representing a keyword in response to a WRITE signal on a write line and a SELECT signal on the associated row select line. Each precharge circuit 12 also produces signals to the memory cells of its associated row to enable the keyword stored in the row of memory cells to be compared with a search word.

For each column of memory cells 10 there is data input circuitry including a drive circuit 21, labelled D and an associated termination circuit 22, labelled T. Bits of data are applied at the data input terminals 15 to the drive circuits 21. During a write operation, a WRITE signal causes the bits of a keyword present at the input terminal 15 to be stored in the particular row of memory cells having a SELECT signal on the associated row select line. During a match operation the bits of a search word present at the data input terminals 15 are applied to all the rows of memory cells for comparison with the stored keywords.

A match output circuit 25, labelled M, is associated with each row. The match circuit 25 holds an indication of the match or no-match results of the comparison of the search word with the keyword stored in the row, and gates the indication over a match output line 17.

Figure 2:
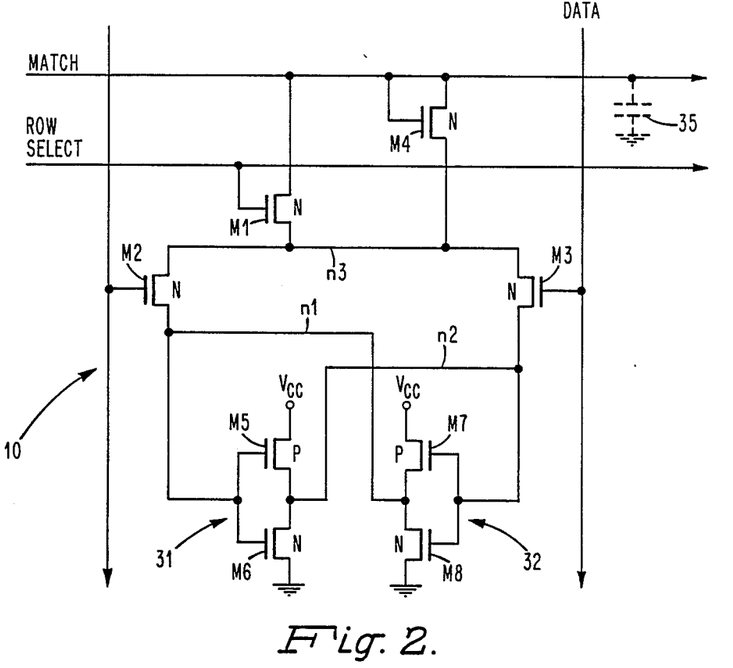
FIG. 2 is a schematic diagram of an individual memory cell of the content-addressable memory of FIG. 1.

A single memory cell 10 of the array is illustrated in the circuit diagram of FIG. 2. The memory cell includes first and second inverter circuits 31 and 32 each employing a pair of CMOS transistors having their inputs and outputs cross-coupled. The cross-coupled inverter circuits store a representation of a single bit of the keyword stored in the associated row without requiring external refreshing. The first inverter 31 includes a p-type MOS transistor M5 and an n-type MOS transistor M6 connected in series between a source of operating potential $V_{CC}$ and ground. Similarly, the second inverted 32 includes a p-type MOS transistor M7 and an n-type MOS transistor M8 connected in series between a source of operating potential $V_{CC}$ and ground The gates of transistors M5 and M6 are connected together and to the juncture of transistors M7 and M8, labelled node n1, and the gates of transistors M7 and M8 are connected to the juncture of transistors M5 and M6, labelled node n2.

A match line which is associated with the row of memory cells is connected to a third node, labelled n3, through a n-type MOS transistor M1. The gate of transistor M1 is connected to the row select lien which is associated with the row of memory cells. Node n3 is connected through an n-type MOS first data switching transistor M2 to node n1 and node n3 is connected to node n2 through an n-type MOS second data switching transistor M3. The gate of transistor M2 is connected to a first data line, labelled data, associated with the column of memory cells, and the gate of transistor M3 is connected to a second data line, labelled $\overline{data}$, associated with the columns of memory cells.

In order to write a representation of a bit of digital information into the memory cell by storing in the cross-coupled inverters 31 and 32, a bit of input data is presented on the data line and its complement is presented on the $\overline{data}$ line. During the write operation the match line is at a low level and a high ROW SELECT signal is present on the row select line enabling the memory cell to write in the input data. The high ROW SELECT signal biases transistor M1 to a conducting condition causing node n3 to be pulled to the low potential of the match line. If the binary value of the bit on the data line is high representing a 1 in the keyboard to be stored, transistor M2 is turned on, or becomes conducting, forcing node n1 to ground. Since the inverters 31 and 32 are cross-coupled, node n2 will be forced into a high voltage level. Conversely, if the binary value of the bit on the $\overline{data}$ line is high, representing a 0 in the keyword to be stored, node n2 will be forced to ground potential by the conducting transistor M3, and node n1 will be forced to a high potential. Subsequently, the row select line is restored to a low level turning off transistor M1, and the data and $\overline{data}$ lines are grounded. Thus, a representation of a bit of digital information is stored in the cross-coupled inverters 31 and 32.

By virtue of the row select lines being activated on a selective row-by-row basis, digital information is written into the array of memory cells one row, or one keyword, at a time. The match operation of comparing a search word with the stored keywords occurs simultaneously on all rows. There is a separate match line associated with each row, but all the match lines are precharged, as will be explained hereinbelow, to a high PRECHARGE potential in preparation for a match comparison.

A match operation starts by first precharging each match line to a high potential or PRECHARGE signal. The charge is stored in the capacitance inherent in the match line as indicated by capacitance 35 shown in phantom. By virtue of the high impedances to which the match line is connected, the match line maintains the charge. The search word provided for comparison with the stored keyword in each row of memory cells is presented on the data and $\overline{data}$ lines, one bit for each column. For purposes of the comparison the binary values of the bit and its complement on the data and $\overline{data}$ lines are reversed as will be explained herebelow. In response to the presence of a bit and its complement on the two lines data and $\overline{data}$, respectively, the data switching transistor M2 or M3 connected to the line which is high is turned on. For example, if the $\overline{data}$ line is high representing a 1 in the search word and turning transistor M3 on and if the potential at node n2 is high corresponding to a 1 in the stored keyword, the charge present on the match line is not affected. That is, the PRECHARGE signal remains providing a MATCH signal. Transistor M4 which is connected as a diode serves to decouple the memory cell from the match line. Thus, the memory cell is not affected by any other occurrences on the match line taking place at other memory cells of the row. If when transistor M3 turns on node n2 is at a low level corresponding to a 0 in the stored keyword, the charge on the match line is discharged through transistor M4, transistor M3, and transistor M6 which is conducting. This action indicates a no-match condition between the bit of the search word present on the data and $\overline{data}$ lines and the representation of the bit stored in the inverters 31 and 32 of the memory cell, and produces a low level NO-MATCH signal on the match line. Thus, if any memory cell in the row operates to discharge the match line, a NO-MATCH signal is produced on the match line for the row. Only if none of the memory cells in the row operate to discharge the match line (all bits in the keyword agree with all the corresponding bits in the search word), is the match line unaffected remaining at the high potential to which it was precharged thus providing a MATCH signal.

Figure 3:
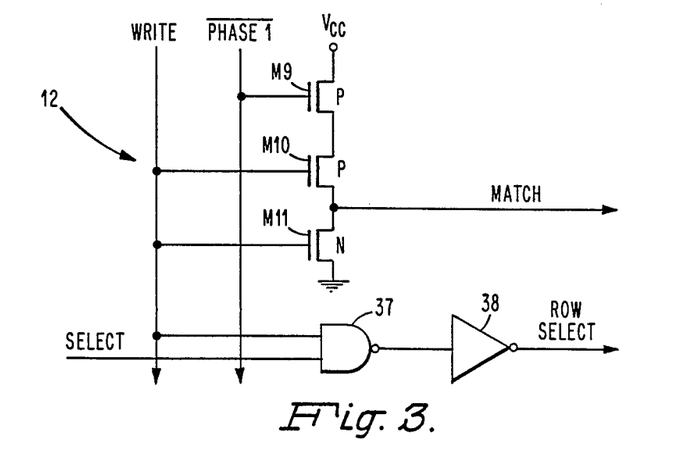
FIG. 3 is a schematic diagram of the precharge circuitry for each row for controlling the write operation and preparing the memory cells for the match operation.

For each row of the memory array there is a precharge cell 12 as illustrated in the schematic circuit diagram of FIG. 3. The write line is connected to all of the precharge circuits. One of the select lines from the decoder 11 (FIG. 1) is connected to the precharge circuit. The phase 1 line of the phase 1 and $\overline{phase\ 1}$ lines for applying clock signals is connected to all of the precharge circuits. The select line and the write line are connected to a NAND gate 37, the output of which is connected to an inverter 38. The output of the inverter 38 is connected to the row select line associated with the row of memory cells. Three CMOS transistors, a first p-type transistor M9, a second p-type transistor M10, and an n-type transistor M11 are connected in series between a source of positive voltage $V_{CC}$ and ground. The gate of the first p-type transistor M9 is connected to the phase 1 line, and the gates of the second p-type transistor M10 and n-type, transistor M11 are connected to the write line. The juncture of transistors M10 and M11 is connected to the match line associated with the row of memory cells.

During a write operation the WRITE signal is high, and if the SELECT signal is high designating the particular row, a ROW SELECT signal which is high is applied to the memory cells of the associated row. At the same time the high level WRITE signal causes n-type MOS transistor M11 to be turned on and p-type MOS transistor M10 to be nonconducting, thereby holding the match line at ground. The $\overline{\text{PHASE 1}}$ signals have no effect on the precharge circuit during a write operation.

During a match operation the write line is low, and therefore the ROW SELECT signal to each row is low. The low level WRITE signal on the write line also biases n-type transistor M11 to nonconduction and p-type transistor M10 to conduction. During the first phase of the match operation, the $\overline{\text{PHASE 1}}$ clock signal is low biasing p-type transistor M9 on. Thus, the match line is charged to the potential $V_{CC}$ producing a PRECHARGE signal on the match line. During the second phase of the match operation the potential on the phase 1 line rises biasing transistor M9 to nonconduction. Transistor M11 remains in a nonconducting condition so that the match line remains at its precharged high level condition. All of the match lines are thus prepared simultaneously for the match operation as described hereinabove in discussing each memory cell of FIG. 2.

Input data either in the form of a keyword to be written into a selected row of memory cells or as a search word to be matched with or compared to each and every one of the keywords stored in the array is introduced into the array by drive circuits 21, one of which is associated with each column of memory cells. A drive circuit 21 and its associated termination circuitry 22 are illustrated in the circuit diagram of FIG. 4.

Figure 4:
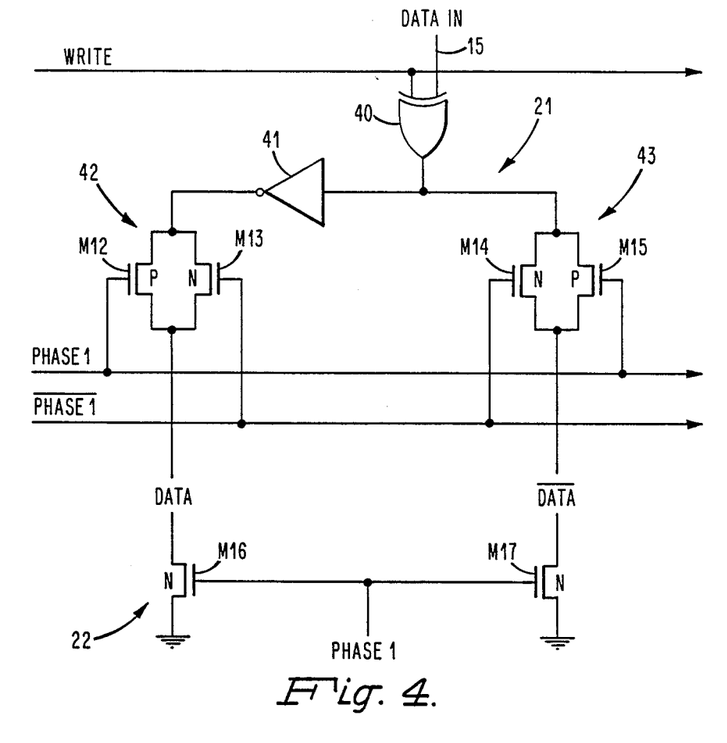
FIG. 4 is a schematic diagram of drive circuitry and associated termination circuitry for each column for applying bits of input data to the memory cells during a write operation and during a match operation.

The data in terminal 15 associated with the column of memory cells and the write line, which is common to all of the drive circuits, are connected to an exclusive-OR circuit 40. The output of the exclusive-OR circuit 40 is connected through an inverter 41 and a first transfer gate 42, consisting or parallel connected p-type MOS transistor M12 and n-type transistor M13, to the data line. The first transfer gate 42 serves as a first data input switch. The output of the exclusive-OR circuit 40 is also connected through a second transfer gate 43, consisting of parallel connected n-type MOS transistor M13 and p-type transistor M15, to the $\overline{\text{data}}$ line. The second transfer gate 43 serves as a second data input switch, the transfer gates 42 and 43 are controlled by the PHASE 1 and $\overline{\text{PHASE 1}}$ clock signals. In the termination section 22 the data line is connected to ground through an n-type MOS transistor M16 and the $\overline{\text{data}}$ line is connected to ground through an n-type MOS transistor 17. The gates of transistors M16 and M17 are controlled by the PHASE 1 clock signal.

Whenever the PHASE 1 clock signal is high and the $\overline{\text{PHASE 1}}$ clock signal is low, the transfer gates 42 and 43 are biased off blocking data in signals at input terminals 15 from the data and $\overline{\text{data}}$ lines. At the same time, the high PHASE 1 clock signal biases transistors M16 and M17 to conduction holding the data and $\overline{\text{data}}$ lines at ground. Thus, a write operation can not occur during these clock signals.

When the PHASE 1 clock signal is low and the $\overline{\text{PHASE}}$ clock signal is high, transfer gates 42 and 43 are turned on and transistors M16 and M17 of the termination circuitry 22 are turned off. A write operation can take place at any time while these conditions are present. During a write operation the WRITE signal is high and the bit to the first transfer gate 42 and the data line has the same binary value as the bit at the data input terminal 15. Its complement is present at the second transfer gate 43 and the $\overline{\text{data}}$ line. A representation of the bit is stored in the cross-coupled inverters of the memory cell as explained hereinabove.

During a match or comparison operation the write line is at a low level. Thus, the exclusive-OR circuit 40 causes a bit of the same binary value as the bit at the data terminal 15 to be present at the input to the second data input switch 43 and its complement to be present at the input to first data input switch 42.

During the first phase of the match operation the high PHASE 1 clock signal and low $\overline{\text{PHASE 1}}$ clock signal bias the first and second transfer gates 42 and 43 nonconducting while causing the data and $\overline{\text{data}}$ lines to be grounded. These conditions prevent any memory cell from discharging the match line while it is being precharged. During the second phase with the PHASE 1 signal becoming low and the $\overline{\text{PHASE 1}}$ signal becoming high, the transfer gates 42 and 43 become conductive. The bit present at the data terminal 15 is present on the data line and its complement is present on the data line and comparison with the stored data takes place at each of the memory cells.

Figure 5:
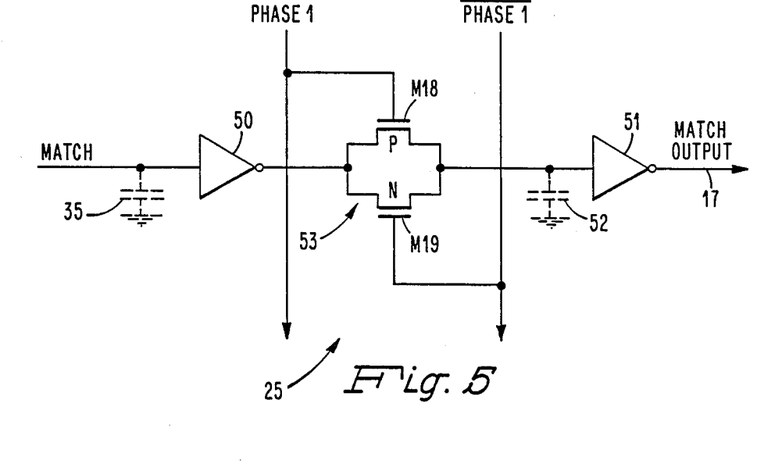
FIG. 5 is a schematic diagram of match output circuitry for each row for reading out the results of a match operation performed on the keyword stored in the memory cells of the row.

Associated with each row of memory cells is a match circuit 25 as illustrated in the schematic circuit diagram of FIG. 5. The match circuit 25 serves to control the timing of the output of the results of the match or comparison operation for its associated row in order to prevent false interpretation of the output information. The match line is connected to the input of an inverter 50 having an output connected to the input of a transfer gate 53, consisting of a p-type MOS transistor M18 and an n-type MOS transistor M19 connected in parallel and serving as an output switch. The output of the transfer gate 53 is connected through a second inverter circuit 51 to the match output line 17.

During the first phase of the match operation when the PHASE 1 clock signal is high and the $\overline{\text{PHASE 1}}$ clock signal is low, the transfer gate 53 is open preventing any occurrence on the match line from affecting the output on the match output line. During this time all the match lines are being charged to the PRECHARGE signal level. The signal previously present on the match line remains at the input to the inverter 51 by virtue of the charge on the line capacitance 52 as illustrated in phantom in FIG. 5. When the PHASE 1 clock signal becomes low and the $\overline{\text{PHASE 1}}$ clock signal becomes high during the second phase of the match operation, the transistors M18 and M19 of the transfer gate 53 become conducting. The change in phase 1 and phase 1 clock signals at the match circuits 25 is delayed slightly with respect to the changes in the clock signals to the precharge circuits 12 and drive circuits 21 to ensure that the match operation has taken place and the MATCH or NO-MATCH signal has been established on the match line. The MATCH or NO-MATCH signal on the match line passes to the match output line 17. Thus a MATCH OUTPUT signal is produced at the output of each row of memory cells indicating whether or not the search word present at the data terminal 15 matches the keyword stored in that row. A low level signal indicates a no-match condition, and a high level signal indicates a match condition.

In summary, a write operation can not take place while the PHASE 1 clock signal is high and the $\overline{\text{PHASE 1}}$ clock signal is low regardless of whether or not the WRITE signal is high. Whenever the PHASE 1 clock signal is low and the $\overline{\text{PHASE 1}}$ clock signal high the presence of a high WRITE signal causes a write operation. The bit at each data in terminal 15 and its complement are present on the data and $\overline{\text{data}}$ lines to the associated columns of memory cells. The row having a high ROW SELECT signal enters representations of the bits in the cross-coupled inverters 31 and 32 of each memory cell of the selected row.

During the first phase of a match or comparison operation while the PHASE 1 clock signal is high and the $\overline{\text{PHASE 1}}$ clock signal is low all of the data and $\overline{\text{data}}$ lines are held at ground and the match line for each row is precharged to a high level. The bits of the search word present at the data in terminals 15 are present at the inputs of the nonconducting second transfer gates 43 and their complements at the inputs of the nonconducting first transfer gates 42. When the PHASE 1 signal goes low and the $\overline{\text{PHASE 1}}$ signal goes high during the second phase of the match operation, the transfer gates 42 and 43 conduct passing the bits and their complements to the $\overline{\text{data}}$ and data lines, respectively. Each memory cell operates as explained previously either to leave the charged match line undisturbed or to discharge it, producing either a MATCH signal or a NO-MATCH signal, respectively, at the match output terminal 17 for the associated row of memory cells.

In a preferred embodiment of the content-addressable memory as shown and described the MOS transistors have the width and length dimensions in micront of the content-addressable memory as shown and described the MOS transistors have the width and length dimensions in microns as shown in the following table.

| Width/Length in microns | | | |
| --- | --- | --- | --- |
| M1 | 5/1.2 | M11 | 20/1.2 |
| M2 | 5/1.2 | M12 | 5/1.2 |
| M3 | 5/1.2 | M13 | 5/1.2 |
| M4 | 5/1.2 | M14 | 5/1.2 |
| M5 | 3/3 | M15 | 5/1.2 |
| M6 | 5/1.2 | M16 | 3/1.2 |
| M7 | 3/3 | M17 | 3/1.2 |
| M8 | 5/1.2 | M18 | 5/1.2 |
| M9 | 10/1.2 | M19 | 5/1.2 |
| M10 | 10/1.2 | | |

In the content-addressable memory as disclosed the data and $\overline{\text{data}}$ lines are decoupled from the memory cell operation. That is, during a match operation the operation of the memory cell does not affect the signals on the data and $\overline{\text{data}}$ lines, and the signals on the data and $\overline{\text{data}}$ lines do not alter the operating states of the cross-coupled inverters containing the stored bit. The discharged condition of the match line during a write operation and the precharged condition of the match line during a match operation and the currents produced as consequences thereof are employed to cause the memory cell to enter a bit of data therein and to compare the stored and applied bit, respectively. This decoupling technique allow s large transistors to be used in the cross-coupled inverters of the memory cells without comprising noise margins, thus permitting a higher speed implementation. There is no need to match the ratio of the capacitances between the data lines and the memory cells, or the sizes of the transistors in the drive circuit and in the cross-coupled inverters of the memory cell. Thus a variety of sizes of fast content-addressable memories can be built from the same basic memory cells.

In addition, a write operation can be carried out at any time except when the memory is being prepared by precharging the match lines during the first phase of a match operation. This feature gives more flexibility in application of the circuit. Each memory cell contains only eight MOS transistors; a small number in relation to the high speed operation of the memory cell. Since the data lines are connected to the memory cells by way of the gates rather than the sources of transistors, capacitance is low and operating speed increased. Each match line is connected to few transistors thus decreasing the capacitance and increasing operating speed.

While there has been shown and described what is considered a preferred embodiment of the present invention, it will be obvious to those skilled in the art that various changes and modifications may be made therein without departing from the invention as defined by the appended claims.

What is claimed is:

1. A content-addressable memory comprising
   an array of memory cells each operable to store a bit of digital information arranged in a matrix of J rows and K columns;
   K first data lines and K second data lines;
   one of said K first data lines and one of said K second data lines associated with a respective column of memory cells and being coupled to each memory cell of the associated column for applying a bit and its complement to the memory cells of that column;
   row select means including J row select lines, each row select line being associated with a row of memory cells and being coupled to each memory cell of that row;
   each memory cell being operable to store a representation of the bit present on the first data line coupled thereto and its complement present on the second data line coupled thereto when a ROW SELECT signal is present on the row select line coupled thereto;
   match means including J match lines, each match line being associated with a row of memory cells and being coupled to each memory cell of that row;
   each memory cell including an enabling means coupled to an associated match line and an associated row select line for making the memory cell operable to accept a bit present on the associated first data line and its complement on the associated second data line and to store the bit and its complement in the memory cell when both a ROW SELECT signal is present on an associated row select line and a PRECHARGE signal is absent on an associated match line; and
   each memory cell further including match discharge means coupled to an associated match line for causing the memory cell to discharge a PRECHARGE charge present on the associated match line thereby producing a NO-MATCH signal on the associated match line when a particular bit value is present on the first data line coupled thereto and its complement is present on the second data line coupled thereto, the NO-MATCH signal indicating that bit values on the first and second data lines do not match the bit values originally stored in the memory cell;
   whereby said enabling means and said match discharge means of each memory cell operate independently of one another wherein during a match cycle only the match discharge means is operable, and during a write cycle only the enabling means is operable.

2. A content-addressable memory in accordance with claim 1 wherein
each memory cell retains the bit stored therein during and subsequent to the presence of a PRECHARGE signal on the match line coupled thereto.

3. A content-addressable memory in accordance with claim 2 including
J precharging means, each precharging means being associated with a row of memory cells;
a write line coupled to each of said precharging means;
J select lines, each select line being coupled to an associated precharging means;
each precharging means being coupled to the row select line which is coupled to the memory cells of the associated row and being operable to produce a ROW SELECT signal thereon when a WRITE signal is present on said write line and a SELECT signal is present on the associated select line coupled thereto; and
each precharging means being coupled to the match line which is coupled to be memory cells of the associated row and being operable to produce a PRECHARGE signal thereon only during the absence of a WRITE signal on said write line.

4. A content-addressable memory in accordance with claim 3 including
means for causing each of said precharging means to charge the associated match line thereby producing said PRECHARGE signal thereon.

5. A content-addressable memory in accordance with claim 4 wherein
each memory cell includes a pair of cross-coupled inverters for storing a bit of digital information.

6. A content-addressable memory in accordance with claim 5 wherein
each of said pairs of cross-coupled inverters includes a first inverter having a first pair of CMOS transistors connected in series and a second inverter having a second pair of CMOS transistors connected in series; and
for each pair of cross-coupled inverters, the input of the first inverter is connected to the output of the second inverter and the input of the second inverter is connected to the output of the first inverter.

7. A content-addressable memory in accordance with claim 6 wherein each memory cell includes
first data switching means coupled to an associated first data line and to the input of a respective first inverter;
second data switching means coupled to an associated second data line and to the input of a respective second inverter;
the enabling means of each memory cell coupling the associated match line and the associated row select line to the first and second data switching means in the memory cell and operable to produce an enabling condition when a PRECHARGE signal is not present on the associated match line and a ROW SELECT signal is present on the associated row select line;
each of said first data switching means being operable to cause said respective first inverter to operate in a first operating state and said respective second inverter operate in a second operating state in response to the presence of a bit of a first binary value on said associated first data line and the presence of a bit of a second binary value on said associated second data line during the occurrence of said enabling condition; and
each of said second data switching means being operable to cause said respective second inverter to operate in said first operating state and said respective first inverter to operate in said second operating state in response to the presence of a bit of said first binary value on said associated second data line and the presence of a bit of the second binary value on said associated first data line during the occurrence of said enabling condition.

8. A content-addressable memory in accordance with claim 7 wherein
each of said match discharge means is coupled between a corresponding match line and associated first and second data switching means;
each of said match discharge means being operable to cause the corresponding match line to discharge producing said NO-MATCH signal thereon when a charge has been placed on the associated match line and a ROW SELECT signal is not present on the associated row select line in response to the presence of a bit of the first binary value on a corresponding first data line and the presence of a bit of the second binary value on a corresponding second data line while said respective first inverter is in said first operating state and said respective second inverter is in said second operating state; and;
each of a match discharge means being operable to cause said corresponding match line to discharge producing said NO-MATCH signal thereon when a charge has been placed on the associated match line and a ROW SELECT signal is not present on the associated row select line in response to the presence of a bit of the second binary value on a corresponding first data line and the presence of a bit of the first binary value on a corresponding second data line while said respective first inverter is in said second operating state and said respective second inverter is in said first operating state.

9. A content-addressable memory in accordance with claim 8 including
K drive means, each drive means being associated with a column of memory cells;
each drive means being coupled to a first data line and to a second data line of the associated column of memory cells;
each of said K drive means having a data input terminal for receiving bits of digital information;
each of said K drive means being operable during a first set of clock signals applied thereto to decouple the corresponding first and second data lines from the associated data input terminal; and
each of said K drive means being operable during a second set of clock signals applied thereto to cause a bit of digital information to be produced on a corresponding first data line and its complement to be produced on a corresponding second second data line as determined by the bit present at the associated data input terminal.

10. A content-addressable memory in accordance with claim 9 wherein each drive means includes
an exclusive-OR means coupled to an associated data input terminal and to said write line;

a first data input switching means coupled to an associated exclusive-OR means and to an associated first data line;

a second data input switching means coupled to each exclusive-OR means and to said second data line;

each exclusive-OR means being operable to provide a bit having the same binary value as the bit present at the associated data input terminal to the associated first data input switching means and to provide its complement to the associated second data input switching means when a WRITE signal is present on the write line;

each exclusive-OR means being operable to provide a bit having the complementary binary value of the bit present at the associated data input terminal to the associated first data input switching means and to provide its complement to the associated second data input switching means when a WRITE signal is absent on the write line; and each first and second data input switching means being biased in a nonconducting condition during said first set of clock signals and being biased in a conducting condition during said second set of clock signals.

11. A content-addressable memory in accordance with claim 10 wherein each drive means includes data line termination means coupled to associated first and second data lines and operable during said first set of clock signals to bias the first and second data switching means of the memory cells of the associated column to a nonconducting condition.

12. A content-addressable memory in accordance with claim 11 wherein each of said precharging means is operable during said first set of clock signals when a WRITE signal is not present on said write line to charge the associated match line to a predetermined voltage level.

13. A content-addressable memory in accordance with claim 12 including

J match output means, each being coupled to a match line associated with a row of memory cells;

J match output terminals, each being coupled to a match line;

each of said match output means being operable to produce a match output signal in accordance with the signal present on the associated match line wherein a selected one of a MATCH signal or NO-MATCH signal is present on the associated match line;

each of said match output means having a match output switching means coupled between the associated match line and the associated match output terminal;

each of said match output switching means being operable during said first of clock signals to prevent the signal present in the respective match line from changing the match output signal at the respective match output terminal; and each of said match output switching means being operable during said second set of clock signals to permit the signal present on the match line to appear as the match output signal at the respective match output terminal.

14. A content-addressable memory comprising an array of memory cells, each operable to store a bit of digital information, arranged in a matrix of J rows and K columns;

K first data lines and K second data lines;

one of said K first data lines and one of said K second data lines being associated with respective column of memory cells and being coupled to each memory cell of the associated column for applying a bit and its complement to the memory cells of that column;

row select means including J row select lines, each row select line being associated with a row of memory cells and being coupled to each memory cell of that row;

each memory cell being operable to store the bit present on the first data line coupled thereto and its complement present on the second data line coupled thereto when a ROW SELECT signal is present on the associated row select line coupled thereto;

match means including J match lines, each match line being associated with a row of memory cells and being coupled to each memory cell of that row;

J precharging means, each precharging means being coupled to a match line associated with a row of memory cells;

means for causing each of said precharging means to charge the associated match line thereby producing a PRECHARGE signal thereon;

each memory cell including a pair of cross-coupled inverter comprising a first inverter having a first MOS transistor and a second MOS transistor, complementary to the first MOS transistor, connected in series between a source of operating potential and a point of reference potential, and a second inverter having a first MOS transistor and a second MOS transistor, complementary to the first transistor of the second inverter connected in series between a source of operating potential and point of reference potential;

the gates of the first and second MOS transistors of the first inverter being connected to the juncture of the first and second MOS transistors of the second inverter at a first node, and the gates of the first and second MOS transistors of the second inverter being connected to the juncture of the first and second MOS transistors of the first inverter at a second node;

an MOS enabling transistor connected between an associated match line and a third node and having its gate connected to an associated row select line;

an MOS first data switching transistor connected between the third node and the first node and having its gate connected to an associated first data line;

an MOS second data switching transistor connected between the third node and the second node and having its gate connected to an associated second data line;

the MOS enabling transistor being biased to a conducting condition when a ROW SELECT signal is present on the associated row select line;

the MOS first data switching transistor being biased to a conducting condition when a bit having a first binary value is present on the associated first data line; and the MOS second data switching transistor of a memory cell being biased to a conducting condition when a bit having the first binary value is present on the associated second data line;

so that, for each memory cell, when a ROW SELECT signal is present on the associated row select line and a PRECHARGE signal is not present on match line, the presence of bit of said first binary value on the first data line causes the first node to be at the potential of the match line causing the first inverter to operate in a first operating state and the second inverter to operate in a second operating state, and the presence of a bit of said second binary value on said second data line causes the second node to be at the potential of the associated match line causing the second inverter to operate in the first operating state and the first inverter to operate in the second operating state; and a unidirectional current flow device connected between the associated match line and the third node of a memory cell for providing a discharge path for the associated match line so that when a ROW SELECT signal is not present on the associated row select line and a charge is present on the associated match line, the presence of a bit of said first binary value on the associated first data line biases the associated first data switching transistor to the conducting condition discharging the match line through the second MOS transistor of the second inverter if that transistor is in a conducting condition thereby producing a NO-MATCH signal; and so that when a ROW SELECT signal is not present on the associated row select line and a charge is present on the associated match line, the presence of a bit of said first binary value on the associated second data line biases the associated second data switching transistor to the conducting condition discharging the associated match line through the second MOS transistor of the first inverter if that transistor is in a conducting condition producing a NO-MATCH signal.

15. A content-addressable memory in accordance with claim 14 further including
a write line coupled to each of said precharging means;
J select lines, each select line being coupled to a corresponding precharging means;
each precharging means being coupled to the row select line which is coupled to the memory cells of the associated row and being operable to produce a ROW SELECT signal thereon during a WRITE signal on said write lie and a SELECT signal on the select line coupled thereto; and
each precharging means being coupled to the match line which is coupled to the memory cells of the associated row and being operable to charge the associated match line thereby producing a PRECHARGE signal thereon only during the absence of a WRITE signal on said write line.

16. A content-addressable memory in accordance with claim 15 further including
K drive means, each drive means being associated with a column of memory cells;
each of said K drive means having a data input terminal for receiving bits of digital information;
each of said K drive means including an exclusive-OR means coupled to an associated data input terminal and to said write line, first data input switching transistors coupled to the exclusive-OR means and to an associated first data line, and second data input switching transistors coupled to the exclusive-OR means and to an associated second data line;
each of said exclusive-OR means being operable to provide a bit having the same binary value as the bit present at the associated data input terminal to the associated first data input switching transistors and to provide its complement to the associated second data input switching transistors determined by the binary value of the bit present at the data input terminal and the presence or absence when a WRITE signal is present on said write line;
each of said exclusive-OR means being operable to provide a bit having the complementary binary value of the bit present at the associated data input terminal to the associated first data input switching transistors and to provide its complement to the associated second data input switching transistors when a WRITE signal is absent on said write line; and
each of said first and second data input switching transistors being biased in a nonconducting condition during said first set of clock signals and being biased in a conducting condition during said second set of clock signals.

17. A content-addressable memory in accordance with claim 16 wherein each drive means includes
a first data line termination transistor coupled between the associated first data line and a point of reference potential and a second data line termination transistor coupled between the second data line and a point of reference potential;
the first and second data line termination transistors in each drive means being operable in a conducting condition during said first set of clock signals to bias the first and second data switching transistors of the memory cells of the associated columns to a nonconducting condition.

18. A content-addressable memory in accordance with claim 17 including
J match output means, each being coupled to a match line associated with a row of memory cells;
J match output terminals, each being coupled to an associated match line;
each of said match output means being operable to produce a match output signal in accordance with the signal present on the associated match line wherein a selected one of a MATCH signal or NO-MATCH signal is present on the associated match line; each of said match output means having match output switching transistors coupled between the associated match line and the associated match output terminal;
each of said match output switching transistors being biased to a nonconducting condition during said first set of clock signals to prevent the signal present on the associated match line from changing the match output signal at the associated match output terminal; and
each of said match output switching transistors being in a conducting condition during said second set of clock signals to permit the signal present on the associated match line to appear as the match output signal at the associated match output terminal.

* * * * *